United States Patent [19]
Samani et al.

[11] Patent Number: 5,406,221
[45] Date of Patent: Apr. 11, 1995

[54] VIDEO AMPLIFIER CIRCUIT WITH GAIN AND ALIGNMENT CONTROL

[75] Inventors: Davood Samani, St-Martin-Le-Vinoux; Guy Gerot, St-Novi-La-Breteche; Jean-Louis Douche, Biviers, all of France

[73] Assignee: SGS-Thomson Microelectronics S.A., Gentilly, France

[21] Appl. No.: 40,509

[22] Filed: Mar. 31, 1993

[30] Foreign Application Priority Data

Apr. 1, 1992 [FR] France .................. 92 03951

[51] Int. Cl.$^6$ .......................................... H03F 3/45
[52] U.S. Cl. ...................................... 330/254; 348/678
[58] Field of Search .................. 330/254, 259, 261, 285, 330/290, 296; 348/678, 682, 707

[56] References Cited

U.S. PATENT DOCUMENTS

| | | |
|---|---|---|
| 3,512,096 | 5/1970 | Nagata et al. |
| 3,727,146 | 4/1973 | Smith . |
| 4,471,320 | 11/1984 | Frey .................. 330/254 |
| 5,146,180 | 9/1992 | Hyakutake .................. 330/254 |
| 5,218,318 | 6/1993 | Ikuzawa .................. 330/254 |

FOREIGN PATENT DOCUMENTS

| | | |
|---|---|---|
| 2013431 | 8/1979 | United Kingdom . |
| 2066600 | 7/1981 | United Kingdom ............ 330/254 |

OTHER PUBLICATIONS

IBM Technical Bulletin vol. 13, No. 8 Jan. 1971 p. 2369.
IBM Technical Bulletin vol. 30 No. 4 Sep. 1987.

*Primary Examiner*—Steven Mottola
*Assistant Examiner*—Tiep H. Nguyen
*Attorney, Agent, or Firm*—Wolf, Greenfield & Sacks

[57] ABSTRACT

The circuit comprises two substantially identical stages (8a, 8b). Each of these two stages (8a, 8b) respectively comprises an input point (10a, 10b) and an output point (11a, 11b) and is arranged to produce, at its output point (11a, 11b), a voltage having an adjustable mean value and variations which are amplified with respect to the variations in the voltage at its respective input point (10a, 10b) with a gain controlled by a gain control signal (Vcg1, Vcg2). The input point (10a) of the first stage (8a) is linked to a decoupling capacitor (30) receiving the input signal (Vin). The output point (11a) of the first stage (8a) supplies the output signal of the circuit (Vout). A comparator (40) is provided for slaving, to a reference voltage (Vref), the voltage at the output point (11b) of the second stage, as well as the mean value of the output signal (Vout).

19 Claims, 1 Drawing Sheet

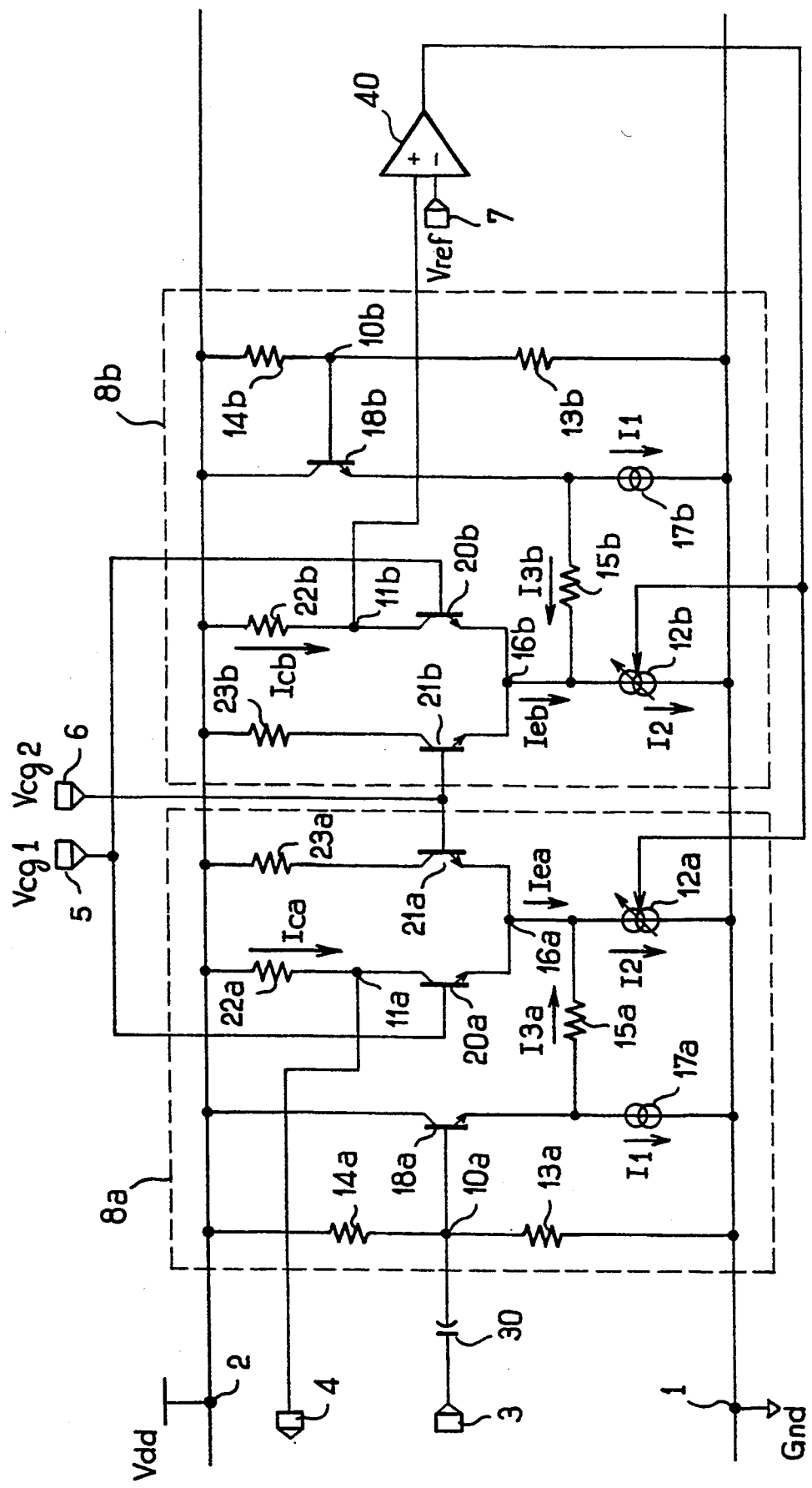

VIDEO AMPLIFIER CIRCUIT WITH GAIN AND ALIGNMENT CONTROL

BACKGROUND OF THE INVENTION

1. Field of the Invention

The present invention relates to a video amplifier circuit with gain and alignment control, for converting an input signal into an output signal having a mean value equal to a reference voltage and variations which are amplified with respect to the variations in the input signal with a gain controlled by a gain control signal.

2. Description of the Prior Art

The circuit has a particular application in the shaping of television signals, for example to the D2MAC standard, intended to be digitally processed in order to produce a television image. Such a television signal usually includes reference sequences making it possible to situate the values of the signal which may vary between a minimum level, known as "black level", and a maximum level, known as "white level". In order to optimize the definition of the image, it is desirable for the analog signal to be amplified so that the interval between the minimum and maximum levels substantially covers the full scale of the analog/digital converters which convert the signal into digital data to be processed. This necessitates, on the one hand, amplification with gain controlled as a function of the amplitude of the input signal, this amplitude being capable of varying due to the source of the signal or to its transmission conditions, and, on the other hand, level adjustment intended to align the amplified signal with respect to the thresholds of the analog/digital converters.

In order to align the signal, a locking technique (clamp) is usually used, in which "clamping" technique the signal passes through a capacitor which is charged to a clamping voltage included in an identifiable reference sequence of each line of the input signal. The capacitor is charged during the reference sequence and should keep a constant charge during the rest of the line. This condition is very difficult to fulfill when the reference sequence is very short compared to the duration of a line, which is the case especially for signals to the D2MAC standard, for which a line lasts 64 μs and includes a reference sequence of about 750 ns.

The present inventors have adopted an approach including controlling the mean value of the output signal and the amplification gain. These two quantities are determined by the digital processors which analyze the output signal of the circuit. The mean value to be applied depends on the contents of the image to be presented and more precisely on the proportion of white in the image. The gain to be applied depends on the amplitude of the variations in the input signal between the maximum and minimum levels, which is independent of the contents of the image.

In order to control the mean value of a signal, one technique is known for compensation by a DC loop, in which the signal is periodically sampled in order to produce an error voltage in the event of drift with respect to the reference voltage, a feedback loop acting to adjust an appropriate DC component when a drift is detected. When the alignment controlled by the DC loop takes place before amplification, the reference voltage should depend on the amplification gain and hence on the amplitude of the input signal while the error voltage is independent of the input signal, which is unacceptable. When the controlled-gain amplification is carried out first, followed by the alignment control by the DC loop, the two controls are certainly made independent, but the variation in the mean value of the input signal with respect to the power supply voltage of the circuit gives rise to unacceptable blocking and saturation phenomena.

The object of the present invention is to provide a video amplifier with gain and alignment control, making it possible to control the mean value of the output signal and the amplification gain independently.

SUMMARY OF THE INVENTION

The invention therefore provides a video amplifier circuit with gain and alignment control, for converting an input signal into an output signal having a mean value equal to a reference voltage and variations which are amplified with respect to the variations in the input signal with a gain controlled by a gain control signal. The circuit includes a first stage and a second stage, substantially identical to the first stage, wherein each of these two stages includes respectively an input point and an output point and is arranged to produce, at its respective output point, a voltage having an adjustable mean value and variations which are amplified with respect to the variations in the voltage at its respective input point with the gain controlled by the gain control signal, and the input point of the first stage is linked to a decoupling capacitor receiving the input signal, and the output point of the first stage supplies the output signal of the circuit. The circuit further includes a comparator having one input linked to the output point of the second stage and one input receiving the reference voltage, this comparator responding to a deviation between the reference voltage and the voltage at the output point of the second stage by producing an alignment adjustment signal which is addressed to the two stages in order to modify identically the mean value of the voltage at the output points of the two stages, so as to make the voltage at the output point of the second stage equal to the reference voltage.

The two stages are identical, and only the first stage receives the variable component of the input signal, its DC component (mean value) being eliminated by the decoupling capacitor. Consequently, the output point of the second stage is at a voltage which reproduces the mean value of the voltage at the output point of the first stage. The comparator receives information from the second stage and acts through a feedback on the two stages, so that the voltage at the output point of the second stage and hence the mean value of the voltage at the output point of the first stage are equal to the reference voltage, whatever the level of the controlled gain.

Thus the desired independence is obtained between the two controls without unacceptable blocking or saturation occurring.

BRIEF DESCRIPTION OF THE DRAWING

Other features and advantages of the present invention will appear in the description below of a preferred and non-limiting embodiment, read in conjunction with the attached drawing, in which FIG. 1 represents an electrical diagram of a video amplifier circuit according to the invention.

DETAILED DESCRIPTION

The preferred circuit represented in the FIG. 1 includes: a ground terminal 1 taken to the ground potential Gnd, a power supply terminal 2 taken to a power supply voltage Vdd, for example of +5 V; an input terminal 3 receiving the input voltage signal Vin to be shaped by the circuit; an output terminal 4 delivering the shaped output voltage signal Vout; two gain control terminals 5, 6 receiving a gain control signal composed of two voltages Vcg1, Vcg2 applied respectively to the terminals 5, 6; and an alignment control terminal 7 receiving a reference voltage Vref.

The circuit is designed so that the output signal Vout has a mean value equal to the reference voltage Vref and variations which are amplified with respect to those of the input signal Vin with a gain controlled by the gain control signal Vcg1, Vcg2, and more precisely by the difference Vcg1−Vcg2 between the two gain control voltages.

The circuit includes a first stage 8a and a second stage 8b identical to the first stage 8a. In the description below, the reference symbols ending in "a" designate components of the first stage 8a, and those ending in "b" designate identical components of the second stage 8b. By "identical", it is understood that to each component of the first stage 8a there corresponds a component of the second stage 8b having substantially the same electrical characteristics. In order to fulfill this condition, the circuit can be produced on a single silicon chip by conventionally forming the corresponding components of the two stages 8a, 8b (which are essentially resistors and transistors) in the course of the same dopant implantation steps.

Each of the two stages 8a, 8b comprises respectively an input point 10a, 10b, an output point 11a, 11b, voltage/current conversion means, an adjustable current generator 12a, 12b, and current multiplication means.

For each stage 8a, 8b, the voltage/current conversion means includes respectively a first bias resistor 13a, 13b mounted between the input point 10a, 10b and ground terminal 1, a second bias resistor 14a, 14b mounted between the input point 10a, 10b and the power supply terminal 2, and a conversion resistor 15a, 15b having a first end linked to the input 16a, 16b of the current multiplication means and a second end linked to the input point 10a, 10b of the stage by means of an isolating buffer. The isolating buffer comprises a constant-current generator 17a, 17b and an npn bipolar transistor 18a, 18b mounted as an emitter follower. The transistor 18a, 18b has its collector linked to the power supply terminal 2, its base linked to the input point 10a, 10b of the stage, and its emitter linked to the second end of the conversion resistor 15a, 15b. The constant-current generator 17a, 17b is mounted between the ground terminal 1 and the emitter of the transistor 18a, 18b and delivers a current I1, identical for both stages, sufficient to make the base/emitter junction of the transistor 18a, 18b conducting. Hence, the voltage/current conversion means of each stage 8a, 8b produces, through the conversion resistor 15a, 15b, a current I3a, I3b having variations proportional to the possible variations in the voltage V1a, V1b at the input point 10a, 10b of the stage. In the case of the second stage 8b, the voltage V2b at the input point 10b does not include a variable component. The current I3b in the conversion resistor 15b is thus DC. This current I3b has a value equal to the mean value of the current I3a in the conversion resistor 15a of the first stage 8a.

The adjustable current generator 12a, 12b of each stage 8a, 8b is mounted between the ground terminal 1 and the input 16a, 16b of the respective current multiplication means. The adjustable current generator 12a, 12b delivers an adjustable current I2 which is identical for both stages. The current multiplication means of each stage thus receive, at their input, a combination Iea=I2−I3a, Ieb=I2−I3b of the current I2 produced by the adjustable current generator 12a, 12b and of the current I3a, I3b produced by the voltage/current conversion means.

For each stage 8a, 8b, the current multiplication means are preferably arranged in the form of a differential amplifier. This amplifier includes two identical npn bipolar transistors 20a and 21a, 20b and 21b and two identical resistors 22a and 23a, 22b and 23b. The identical resistors 22a and 23a, 22b and 23b are connected respectively between the power supply terminal 2 and the collectors of the transistors 20a and 21a, 20b and 21b. The transistors 20a and 21a, 20b and 21b have their respective emitters linked Jointly to the input 16a, 16b of the current multiplication means. The base of the transistor 20a, 20b is linked to the gain control terminal 5 and hence receives the gain control voltage Vcg1. The base of the transistor 21a, 21b is linked to the gain control terminal 6 and thus receives the gain control voltage Vcg2. The amplifier thus configured produces, through the resistor 22a, 22b, a current Ica, Icb equal to the current Iea, Ieb received at the input 16a, 16b of the amplifier, multiplied by a factor k, lying between 0 and 1, imposed by the gain control voltage Vcg1, Vcg2, and more precisely by the difference Vcg1−Vcg2 between the two gain control voltages.

The output point 11a, 11b of each stage 8a, 8b is directly linked to the collector of the transistor 20a, 20b. The output point 11a, 11b of each stage is thus arranged to be at a voltage V2a, V2b, having, with respect to the current Ica, Icb produced by the current multiplication means, a linear dependence given by:

$$V2a = Vdd - R \times Ica$$

$$V2b = Vdd - R \times Icb$$

where R designates the ohmic value of the resistors 22a, 22b. Consequently, the voltage V2a, V2b at the output point 11a, 11b of each stage has a mean value which can be adjusted by modifying the current I2 delivered by the adjustable current generator 12a, 12b, and variations which are amplified with respect to the variations in the voltage V1a, V1b at the input point 10a, 10b of the stage with a gain g controlled by the gain control voltage Vcg1, Vcg2. The gain g is given by the expression $g = k \times R/R3$, where R3 designates the ohmic value of the conversion resistor 15a, 15b of each stage. The gain control voltage Vcg1, Vcg2 will thus be determined in order to obtain a multiplication factor k giving the desired gain g.

The output point 11a of the first stage 8a is linked to the output terminal 4 of the circuit in order to deliver an output signal Vout corresponding to the voltage V2a at this point 11a.

The input point 10a of the first stage 8a is linked to the input terminal 3 of the circuit by means of a decoupling capacitor 30. The capacitor 30 filters the DC component of the input signal Vin which it receives and passes on to the input point 10a of the first stage the variations in the input signal Vin. The capacitor 30 should therefore have a capacitance C such that the time constant $R1 \times R2 \times C/(R1+R2)$ is high compared to the time scale of the variations in the input signal, R1 and R2 respectively designating the ohmic values of the first and second bias resistors 13a, 14a, of the first stage. Typically, a capacitance C on the order of a few microfarads, and resistors R1, R2 on the order of a few hundred ohms may be chosen for an input signal having a frequency on the order of one megahertz or of about ten megahertz.

The voltage V1a at the input point 10a of the first stage, which is equal to the voltage at the terminals of the conversion resistor 15a of the first stage, is given by V1a=VP+VA, where VP=Vdd×R1/(R1+R2) is a constant bias voltage and VA designates the variable component of the input signal Vin. The voltage V2a at the output point 11a of the first stage is hence given by:

$$V2a = VM + g \times VA$$

where VM=Vdd+g×(VP−Vbe)−R×k×I2 represents the mean value of the voltage V2a (Vbe designating the voltage of the base/emitter junction of the transistor 18a). It can be seen that this mean value may be adjusted by modifying the current I2 delivered by the adjustable current generator 12a.

As the second stage 8b receives no variable signal at its input point 10b, its output point 11b is at a stable voltage V2b equal to the mean value VM of the voltage V2a at the output point of the first stage.

In order to fix this voltage value V2b=VM, the circuit includes a comparator 40 having a positive input linked to the output point 11b of the second stage 8b, and a negative input linked to the alignment control terminal 7 for receiving the reference voltage Vref. When a deviation exists between the voltage V2b at the point 11b and the reference voltage Vref, the comparator 40 responds by producing an alignment adjustment signal Verr which is addressed to the two stages 8a, 8b in order to modify identically the mean value VM of the voltage at the output points 11a, 11b of the two stages.

The comparator 40 is preferably in the form of a high-gain, fast response amplifier produced in BICMOS technology, which includes combining bipolar transistors and CMOS (complementary metal-oxide-semiconductor) transistors. Such an operational amplifier, known per se, may have a response time of about 100 ns with a low bias current (about 1 μA). The output of the amplifier 40 is linked to the control inputs of the adjustable current generators 12a, 12b of the two stages. These generators 12a, 12b increase or reduce the current I2 which they deliver when they receive a positive or negative alignment adjustment signal Verr.

The comparator 40 is thus connected in a feedback loop which acts on the second stage 8b in order to force the voltage V2b at its output point 11b to the reference value Vref. It acts also on the first stage 8a so that the mean value VM of the output voltage Vout supplied at the output point 11a is equal to the reference voltage Vref. This action by the comparator 40 and by the adjustable current generators 12a, 12b is independent of the controlled value of the gain g. By producing the comparator 40 in BICMOS technology, it is possible to respond in about 100 ns to a modification in the reference voltage Vref of the order of one volt without affecting the gain control.

In the particular application of the circuit to the shaping of D2MAC standard signals, the input signal Vin is the analog signal present at the output of the demodulator (in the case of radio transmission), or of the cable interface (in the case of cable transmission). The output signal Vout is addressed to an analog/digital converter which converts the described embodiment with a view to processing by a specialized processor. This processor analyzes the signal rout in order to determine the gain control signal Vcg1, Vcg2 and the reference voltage Vref to be applied to the control terminals 5, 6, 7 of the circuit. When necessary, the processor varies the reference voltage Vref, and the circuit according to the invention is capable of adapting practically instantaneously to this variation.

Although the invention has been described by reference to a preferred exemplary embodiment, it will be understood that this example is not limiting and that various modifications may be applied to it without departing from the scope of the invention.

We claim:

1. A video amplifier circuit with gain and alignment control, for converting an input signal into an output signal having a mean value equal to a reference voltage and variations which are amplified with respect to variations in the input signal with a gain controlled by a gain control signal, the video amplifier circuit comprising:

a first stage and a second stage substantially identical to the first stage, wherein each of the two stages includes respectively an input node receiving an input voltage and an output node providing an output voltage having an adjustable mean value and variations which are amplified with respect to any variations in the input voltage at its respective input node with a gain controlled by the gain control signal, wherein the gain of the first stage being the gain of the video amplifier circuit, and wherein the input node of the first stage receives the input signal and the output node of the first stage supplies the output signal of the circuit, wherein the input node of the first stage is connected to a decoupling capacitor and wherein the circuit further comprises a comparator for controlling the mean value of the output signal having one input coupled to the output node of the second stage and one input receiving the reference voltage, the comparator responding to a deviation between the reference voltage and the voltage at the output node of the second stage by producing an alignment adjustment signal which is addressed to the two stages in order to modify identically the adjustable mean values of the voltages at the output nodes of the two stages, so as to make the voltage at the output node of the second stage substantially equal to the reference voltage and such that the mean value of the output signal is substantially independent of a mean value of the input signal and the gain.

2. The circuit as claimed in claim 1, wherein each of the two stages comprises voltage/current conversion means for converting the input voltage at the respective input node into a converted current having variations proportional to the variations in the input voltage at the input node, an adjustable current generator producing an adjustable current, and current multiplication means having an input receiving a combination of the converted current produced by the voltage/current conversion means and the adjustable current produced by the adjustable current generator, the current multiplication means for multiplying the combination of currents by a factor imposed by the gain control signal to produce a product current, the output node of each of the stages being arranged to be at a voltage depending linearly on the product current produced by the respective current multiplication means.

3. The circuit as claimed in claim 2, wherein the voltage/current conversion means of each stage respectively comprise a first resistor connected between the input node and a ground terminal, a second resistor mounted between the input node and a power supply terminal of the circuit, and a third resistor having one end coupled to the input of the current multiplication means and another end coupled to the input node through an isolating buffer.

4. The circuit as claimed in claim 3, wherein the isolating buffer comprises a bipolar transistor mounted as an emitter follower and coupled to the third resistor.

5. The circuit as claimed in claim 2 wherein the current multiplication means of each stage comprise two substantially identical bipolar transistors having their respective emitters coupled jointly to the input of the current multiplication means, and two substantially identical resistors coupled respectively to collectors of the two bipolar transistors, the gain control signal including two voltages respectively applied to bases of the two bipolar transistors.

6. The circuit as claimed in claim 5, wherein the output node of each stage is coupled to the collector of one of the bipolar transistors of the respective current multiplication means.

7. The circuit as claimed in claim 1, wherein the comparator comprises a high gain, low consumption, fast response amplifier.

8. The circuit as claimed in claim 7, wherein the high gain amplifier is produced in BICMOS technology.

9. A video amplifier circuit with gain and alignment control comprising:
an input terminal receiving an input signal;
an output terminal providing an output signal having a mean value substantially equal to a reference voltage and having gain variations in the input signal;
a first circuit stage coupled to the input and output terminals;
a second circuit stage coupled to the first circuit stage, each circuit stage including an input node receiving an input voltage, and an output node providing an output voltage having an adjustable mean value and the gain controlled by a gain control signal wherein the gain of the first circuit stage being the gain of the video amplifier circuit;
a decoupling capacitor, coupled between the input terminal and the input node of the first circuit stage, receiving the input signal and providing, to the input node of the first circuit stage, the input voltage; and
a comparator for controlling the mean value of the output signal having a first input coupled to the output node of the second circuit stage and a second input receiving the reference voltage, the comparator responding to a deviation between the reference voltage and output voltage of the second circuit stage by producing an alignment adjustment signal provided to the first and second circuit stages to adjust the adjustable mean value such that the output voltage of the second stage is substantially equal to the reference voltage and such that the mean value of the output signal is substantially independent of a mean value of the input signal and the gain of the video amplifier circuit.

10. A video amplifier circuit as claimed in claim 9 wherein each circuit stage further includes:
a voltage/current conversion circuit, coupled to the input node, converting the input voltage to a converted current having variations from a mean value of the converted current proportional to variations from the mean value of the input voltage;
an adjustable current generator circuit, coupled to the voltage/current conversion circuit, producing an adjustable current; and
a current multiplication circuit, coupled to the voltage/current conversion circuit and the adjustable current generator circuit, receiving the converted current and the adjustable current, multiplying a sum of the converted current and the adjustable current by a factor dependent on the gain control signal to produce a multiplied current, wherein the output voltage is substantially linearly dependent on the multiplied current.

11. A video circuit as claimed in claim 10 wherein the voltage/current conversion circuit includes:
a first resistor coupled between the input node and a ground terminal;
a second resistor coupled between the input node and a power supply terminal; and
a third resistor coupled to the current multiplication circuit and to the input node through an isolation buffer.

12. A video circuit as claimed in claim 11 wherein the isolation buffer includes a bipolar transistor connected in an emitter follower arrangement and coupled to the third resistor.

13. A video circuit as claimed in claim 11 wherein the current multiplication circuit includes:
an input line;
first and second bipolar transistors, each transistor having a base terminal, a collector terminal and an emitter terminal, the emitters of the first and second bipolar transistors coupled to the input line of the current multiplication circuit;
fourth and fifth resistors coupled respectively to the collectors of the first and second bipolar transistors; and
first and second input voltage terminals, coupled respectively to the bases of the first and second bipolar transistors, supplying first and second gain control voltages to the bases of the first and second bipolar transistors, wherein the gain control signal includes the first and second gain control voltages.

14. A video circuit as claimed in claim 13 wherein the output node of each circuit stage is coupled to the collector terminal of one of the bipolar transistors of the corresponding current multiplication circuit.

15. A video circuit as claimed in claim 10 wherein the comparator includes an amplifier having a first input coupled to the output node of the second circuit stage and a second input receiving the reference voltage.

16. A video circuit as claimed in claim 15 wherein the amplifier is produced in BICMOS technology.

17. A video amplifier circuit with gain and alignment control comprising:
an input terminal receiving an input signal;
an output terminal providing an output signal having a mean value substantially equal to a reference voltage;
a first circuit stage coupled to the input and output terminals;

a second circuit stage coupled to the first circuit stage, each circuit stage including an input node receiving an input voltage, an output node providing an output voltage on the output node having an adjustable mean value and variations from the adjustable mean value which are amplified with respect to variations from a mean value of the input voltage, and a gain controlled by a gain control signal;

means, coupled between the input terminal and the input node of the first circuit stage, for receiving the input signal and providing, to the input node of the first circuit stage, the input voltage; and comparator means having a first input coupled to the output node of the second circuit stage and a second input receiving the reference voltage, for responding to a deviation between the reference voltage and output voltage of the second circuit stage and producing an alignment adjustment signal for provision to the first and second circuit stages to adjust the adjustable mean value of the output voltage of the second circuit stage such that the output voltage of the second circuit stage is substantially equal to the reference voltage and such that the mean value of the output signal is substantially independent of a mean value of the input signal and the gain of the first circuit stage.

18. A method for producing, from an input signal, an output signal having a adjustable value substantially equal to a reference voltage, comprising the steps of:

receiving the input signal;

providing, from the input signal, an input voltage to an input node;

producing, from the input voltage, an output voltage corresponding to the output signal having the adjustable mean value;

amplifying variations of the input voltage from a mean value of the input voltage to produce variations of the output voltage from the adjustable mean value; and responding to a deviation between the reference voltage and the adjustable means value of the output voltage by producing an alignment adjustment signal for adjusting the output voltage such that the adjustable mean value of the output voltage will be substantially equal to the reference voltage and such that the adjustable mean value of the output signal is substantially independent of the mean value of the input signal.

19. A method as claimed in claim 18 further including the step of, after the step of providing the input voltage, converting the input voltage to a current having variations from a mean value of the current proportional to the variations of the input voltage from the mean value of the input voltage.

* * * * *